United States Patent
Ichinokura et al.

(10) Patent No.: US 10,840,414 B2
(45) Date of Patent: Nov. 17, 2020

(54) OPTICAL SEMICONDUCTOR APPARATUS AND METHOD OF MANUFACTURING OPTICAL SEMICONDUCTOR APPARATUS

(71) Applicant: Nikkiso Co., Ltd, Tokyo (JP)

(72) Inventors: Hiroyasu Ichinokura, Hakusan (JP); Hisanori Ishiguro, Hakusan (JP); Kenta Ura, Hakusan (JP)

(73) Assignee: NIKKISO CO., LTD., Tokyo (JP)

( * ) Notice: Subject to any disclaimer, the term of this patent is extended or adjusted under 35 U.S.C. 154(b) by 0 days.

(21) Appl. No.: 16/284,217

(22) Filed: Feb. 25, 2019

(65) Prior Publication Data
US 2019/0189862 A1   Jun. 20, 2019

Related U.S. Application Data

(63) Continuation of application No. PCT/JP2017/029115, filed on Aug. 10, 2017.

(30) Foreign Application Priority Data

Sep. 1, 2016   (JP) .................................. 2016-171230

(51) Int. Cl.
*H01L 33/48* (2010.01)
*H01L 23/02* (2006.01)
(Continued)

(52) U.S. Cl.
CPC ............ *H01L 33/486* (2013.01); *H01L 23/02* (2013.01); *H01L 23/10* (2013.01); *H01L 33/20* (2013.01);
(Continued)

(58) Field of Classification Search
CPC ....... H01L 33/486; H01L 33/52; H01L 33/54; H01L 33/62; H01L 33/20; H01L 23/10; H01L 23/02; H01L 2224/16225
See application file for complete search history.

(56) References Cited

U.S. PATENT DOCUMENTS 6,872,984 B1 *   3/2005   Leung ................... B81B 7/0067
                                                        174/50.5
2004/0022502 A1 *   2/2004   Zhou ................... H01S 5/02288
                                                        385/94
(Continued)

FOREIGN PATENT DOCUMENTS

JP   S62217639 A   9/1987
JP   02125345 U   10/1990
(Continued)

OTHER PUBLICATIONS

Office Action dated Mar. 10, 2020 in KR Application No. 10-2019-7005904.
(Continued)

*Primary Examiner* — Joseph C. Nicely
(74) *Attorney, Agent, or Firm* — Muncy, Geissler, Olds & Lowe, P.C.

(57) ABSTRACT

An optical semiconductor apparatus includes: a package substrate that includes a recess that opens on a top surface of the package substrate; a light emitting device housed in the recess; a window member provided to cover an opening of the recess; and a sealing structure that seals a space between the package substrate and the window member. The sealing structure includes a first metal layer provided in a shape of a frame on the top surface of the package substrate, a second metal layer provided in a shape of a frame on an inner surface of the window member, and a metal bonding part provided between the first metal layer and the second metal layer. An entirety of one of the first and second metal layers is positioned in a region where the other of the first and second metal layers is provided.

12 Claims, 7 Drawing Sheets

(51) Int. Cl.
*H01L 33/52* (2010.01)
*H01L 33/62* (2010.01)
*H01L 23/10* (2006.01)
*H01L 33/56* (2010.01)
*H01L 33/20* (2010.01)
*H01L 33/54* (2010.01)

(52) U.S. Cl.
CPC .............. *H01L 33/52* (2013.01); *H01L 33/54* (2013.01); *H01L 33/56* (2013.01); *H01L 33/62* (2013.01); *H01L 2224/16225* (2013.01); *H01L 2933/0033* (2013.01)

(56) References Cited

U.S. PATENT DOCUMENTS

| | | | | |
|---|---|---|---|---|
| 2011/0205739 | A1* | 8/2011 | Ueji | H01L 33/486 362/267 |
| 2011/0266572 | A1* | 11/2011 | Dobbertin | H01L 51/5036 257/98 |
| 2014/0186999 | A1* | 7/2014 | Schweikert | H01L 31/0203 438/106 |
| 2014/0367718 | A1* | 12/2014 | Park | H01L 33/486 257/98 |
| 2015/0014711 | A1 | 1/2015 | Bergenek et al. | |
| 2015/0243617 | A1* | 8/2015 | Osenbach | H01L 24/13 257/737 |
| 2015/0329351 | A1* | 11/2015 | Cheng | B81C 1/00238 257/417 |
| 2016/0181290 | A1* | 6/2016 | Wang | H01L 27/1225 257/43 |
| 2017/0112952 | A1* | 4/2017 | Kato | A61L 2/10 |

FOREIGN PATENT DOCUMENTS

| | | | |
|---|---|---|---|
| JP | 2012069977 A | | 4/2012 |
| JP | 2015018873 A | * | 1/2015 |
| JP | 2015018873 A | | 1/2015 |
| WO | WO2007037365 A1 | | 4/2007 |
| WO | WO2016103547 A1 | | 6/2016 |
| WO | WO-2018043096 A1 | * | 3/2018 ............. H01L 33/40 |

OTHER PUBLICATIONS

European Search Report dated Mar. 19, 2020 in EP Application No. 17846102.6.

* cited by examiner

210

OPTICAL SEMICONDUCTOR APPARATUS AND METHOD OF MANUFACTURING OPTICAL SEMICONDUCTOR APPARATUS

RELATED APPLICATION

Priority is claimed to Japanese Patent Application No. 2016-171230, filed on Sep. 1, 2016, the entire content of which is incorporated herein by reference.

BACKGROUND OF THE INVENTION

1. Field of the Invention

The present invention relates to optical semiconductor apparatuses, and, more particularly, to an optical semiconductor apparatus including an optical semiconductor device.

2. Description of the Related Art

Nowadays, semiconductor light emitting devices such as light emitting diodes and laser diodes that emit blue light have been in practical use. Development of light emitting devices that output deep ultraviolet light having a shorter wavelength has also been pursued. Deep ultraviolet light has sterilization capability. Semiconductor light emitting devices capable of outputting deep ultraviolet light have attracted attention as a mercury free sterilization light source in medical and food processing fronts. Recently, efforts have been made to develop semiconductor light emitting devices with a higher emission intensity, irrespective of the output wavelength.

A light emitting device is housed in a package to protect the device from an external environment. A light emitting device is sealed by eutectically bonding a substrate on which the light emitting device is mounted and a glass lid provided on the substrate. In this process, materials having linear expansion coefficients as similar as possible are selected as the materials of the substrate and the glass lid.

It is preferred that the window member of the package that houses the light emitting device be made of a material having a high transmittance of the emission wavelength. Materials of the window member available for selection are limited depending on the emission wavelength of the light emitting device. This may make it difficult to allow the package substrate and the window member subject to eutectic bonding to have similar coefficients of thermal expansion. It is desired to obtain a reliable sealing structure even when materials having different coefficients of thermal expansion are used for the package substrate and the window member.

SUMMARY OF THE INVENTION

In this background, one illustrative purpose of the present invention is to provide a technology of increasing the reliability of an optical semiconductor apparatus that includes an optical semiconductor device.

An optical semiconductor apparatus according to an embodiment of the present invention includes: a package substrate that includes a recess opening on a top surface of the package substrate; an optical semiconductor device housed in the recess; a window member provided to cover an opening of the recess; and a sealing structure that seals a space between the package substrate and the window member. The sealing structure includes a first metal layer provided in a shape of a frame on the top surface of the package substrate, a second metal layer provided in a shape of a frame on an inner surface of the window member, and a metal bonding part provided between the first metal layer and the second metal layer, the sealing structure being configured such that an entirety of one of the first metal layer and the second metal layer is positioned in a region where the other of the first metal layer and the second metal layer is provided.

The embodiment is configured such that the entirety of the one of the metal layers that is relatively narrower is positioned in a region of the other of the metal layers that is relatively wider. Therefore, the range in which the metal layers overlap is configured to be larger than when one metal layer and the other metal layer are provided out of alignment. This enlarges the range in which the metal layers overlap and are bonded and increases the sealing performance. Further, by enlarging the range in which the metal layers overlap, the range in which the metal bonding part is formed in a thin fillet shape along one of the metal layers is reduced. This prevents cracks or chipping from being produced in the window member due to concentration in the thin fillet of a stress caused by a difference in the coefficient of thermal expansion.

The sealing structure may be configured such that an entirety of the second metal layer is positioned in a region where the first metal layer is provided.

The sealing structure may be configured such that the metal bonding part is positioned on both sides sandwiching the second metal layer.

An outer dimension of the first metal layer is larger than an outer dimension of the second metal layer, an inner dimension of the first metal layer is smaller than an inner dimension of the second metal layer, and an inner dimension difference between the first metal layer and the second metal layer is larger than an outer dimension difference between the first metal layer and the second metal layer.

A difference between an outer dimension and an inner dimension of the first metal layer may be twice or more as large as a difference between an outer dimension and an inner dimension of the second metal layer.

The window member may be made of a material having a smaller coefficient of thermal expansion than the package substrate.

The optical semiconductor device may be a light emitting device for emitting deep ultraviolet light, the window member may be made of quartz glass, and the metal bonding part may contain gold-tin (AuSn).

Another embodiment of the present invention relates to a method of manufacturing an optical semiconductor apparatus. The method includes: housing an optical semiconductor device in a recess of a package substrate, the recess opening on a top surface of the package substrate, and a first metal layer in a shape of a frame being provided on the top surface; providing a window member to cover an opening of the recess, a second metal layer in a shape of a frame being provided on an inner surface of the window member; and sealing a space between the package substrate and the window member by heating a metal bonding member provided between the first metal layer and the second metal layer. The providing a window member includes aligning the first metal layer and the second metal layer such that an entirety of one of the first metal layer and the second metal layer is positioned in a region where the other of the first metal layer and the second metal layer is provided.

The embodiment is configured such that the entirety of the one of the metal layers that is relatively narrower is positioned in a region of the other of the metal layers that is relatively wider. Therefore, the range in which the metal layers overlap is configured to be larger than when one metal layer and the other metal layer are provided out of alignment. This enlarges the range in which the metal layers overlap and are bonded and increases the sealing performance. Further, by enlarging the range in which the metal layers overlap, the range in which the metal bonding part is formed in a thin fillet shape along one of the metal layers is reduced. This prevents cracks or chipping from being produced in the window member due to concentration in the thin fillet of a stress caused by a difference in the coefficient of thermal expansion.

The sealing may include heating the metal bonding member while a load is being applied between the package substrate and the window member.

The sealing may include cooling the metal bonding member while a load is being applied between the package substrate and the window member, after heating the metal bonding member.

The metal bonding member may be an gold-tin (AuSn) metal plate having a shape of a frame corresponding to the first metal layer or the second metal layer.

The metal bonding member may have a thickness of not less than 10 μm and not more than 50 μm.

DETAILED DESCRIPTION OF THE INVENTION

Figure 1:
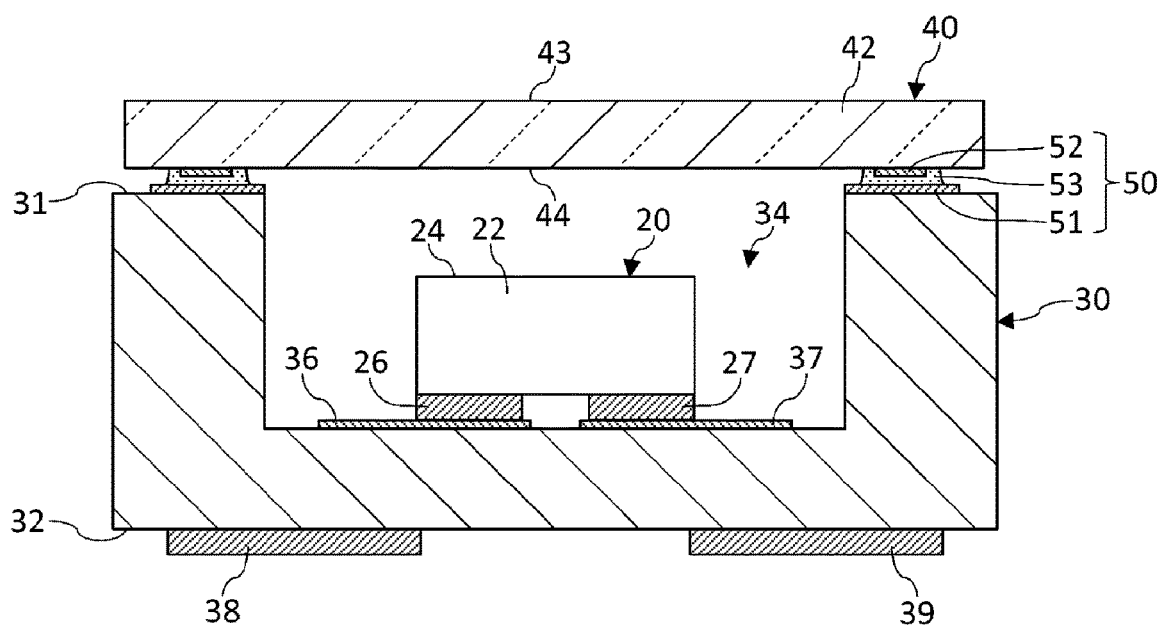
FIG. 1 is a cross-sectional view schematically showing a light emitting apparatus according to an embodiment.

The invention will now be described by reference to the preferred embodiments. This does not intend to limit the scope of the present invention, but to exemplify the invention.

A detailed description will be given of embodiments of the present invention with reference to the drawings. Like numerals are used in the description to denote like elements and duplicate descriptions are omitted as appropriate. To facilitate the understanding, the relative dimensions of the constituting elements in the drawings do not necessarily mirror the relative dimensions in the actual apparatus.

Figure 2:
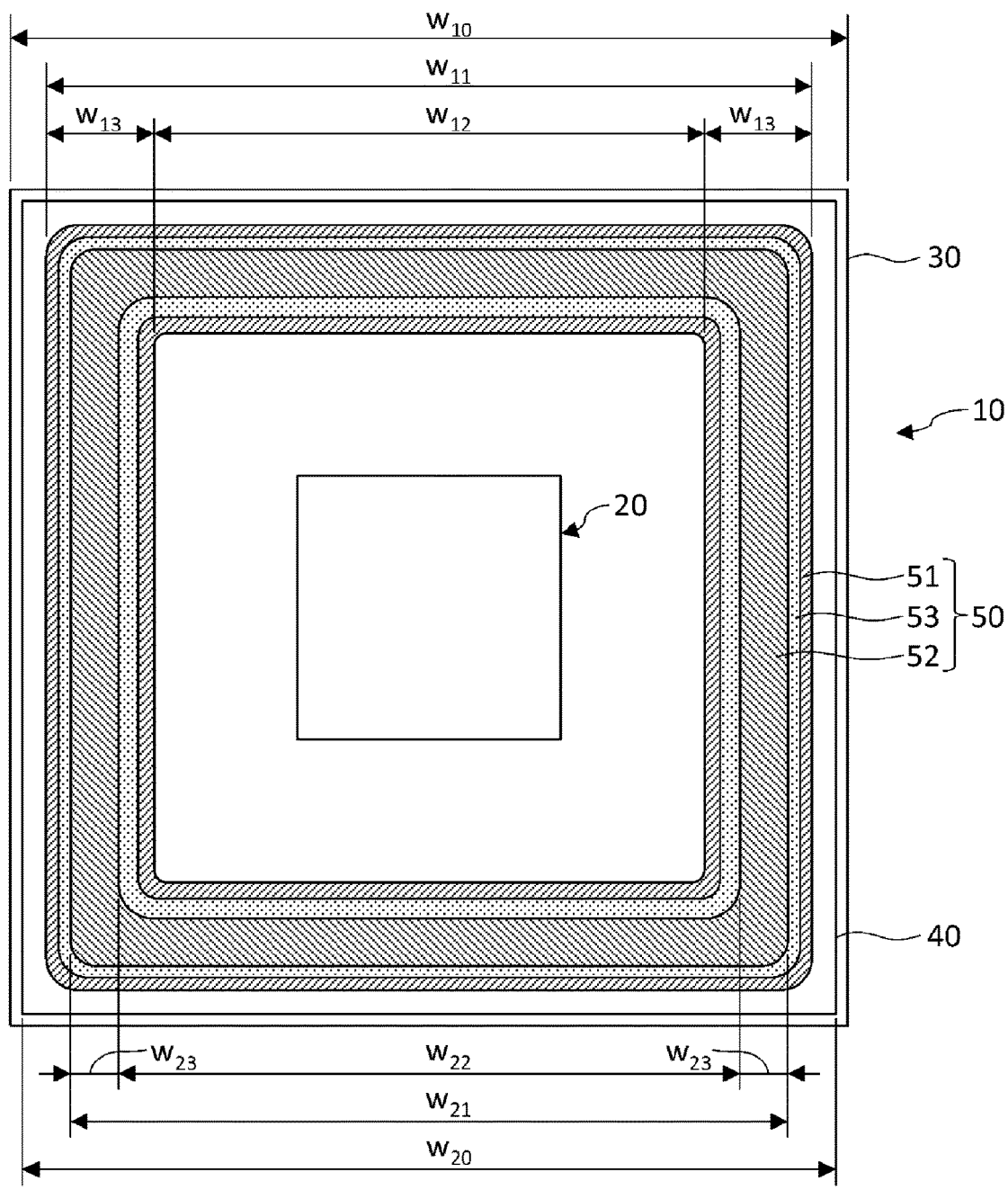
FIG. 2 is a top view schematically showing the light emitting apparatus of FIG. 1.

FIG. 1 is a cross-sectional view schematically showing a light emitting apparatus 10 according to an embodiment, and FIG. 2 is a top view schematically showing the light emitting apparatus 10 of FIG. 1. The light emitting apparatus 10 includes a light emitting device 20, a package substrate 30, a window member 40, and a sealing structure 50. The light emitting apparatus 10 is an optical semiconductor apparatus including the light emitting device 20, which is an optical semiconductor device.

The light emitting device 20 is a light emitting diode (LED) chip configured to emit "deep ultraviolet light" having a central wavelength λ of about 360 nm or lower. To output deep ultraviolet light having such a wavelength, the light emitting device 20 is made of an aluminum gallium nitride (AlGaN) based semiconductor material having a band gap of about 3.4 eV. The embodiment particularly discusses a case of emitting deep ultraviolet light having a central wavelength λ of about 240 nm~350 nm.

The light emitting device 20 includes a semiconductor stack structure 22, a light emission surface 24, a first device electrode 26, and a second device electrode 27.

The semiconductor stack structure 22 includes a template layer, an n-type clad layer, an active layer, a p-type clad layer, etc. built on a substrate that embodies the light emission surface 24. When the light emitting device 20 is configured to output deep ultraviolet light, a sapphire ($Al_2O_3$) substrate is used as the substrate embodying the light emission surface 24, and an aluminum nitride (AlN) layer is used as the template layer of the semiconductor stack structure 22. The clad layer and the active layer of the semiconductor stack structure 22 are made of an AlGaN-based semiconductor material.

The first device electrode 26 and the second device electrode 27 are electrodes for supplying carriers to the active layer of the semiconductor stack structure 22 and are an anode electrode and a cathode electrode, respectively. The first device electrode 26 and the second device electrode 27 are provided opposite to the light emission surface 24. The first device electrode 26 is attached to a first inner electrode 36 of the package substrate 30, and the second device electrode 27 is attached to a second inner electrode 37 of the package substrate 30.

The package substrate 30 is a rectangular member having a top surface 31 and a bottom surface 32. The package substrate 30 is a ceramic substrate that contains alumina ($Al_2O_3$), aluminum nitride (AlN), etc. and is a so-called high temperature co-fired ceramic (HTCC) multilayer substrate.

A recess 34 for housing the light emitting device 20 is provided on the top surface 31 of the package substrate 30. The first inner electrode 36 and the second inner electrode 37 to which the light emitting device 20 is attached are provided on the bottom surface of the recess 34. On the bottom surface 32 of the package substrate 30 are provided a first outer electrode 38 and a second outer electrode 39 for mounting the light emitting apparatus 10 on, for example, an external substrate.

The window member 40 is a plate-like protective member provided to cover the opening of the recess 34. The window member 40 is made of a material that transmits ultraviolet light emitted by the light emitting device 20. For example, glass, quartz, crystal, sapphire, etc. may be used. The window member 40 is preferably made of a material having a high deep ultraviolet transmittance and having a high heat resistance and airtightness. It is preferred that the window member 40 is made of a material having a smaller coefficient of thermal expansion than the package substrate 30. Quartz glass is a material having such a property and is desirably used in the window member 40. The ultraviolet light emitted by the light emitting device 20 is output via the window member 40 from an outer surface 43 of the window member 40 to a space outside the package.

The sealing structure 50 includes a first metal layer 51, a second metal layer 52, and a metal bonding part 53.

The first metal layer 51 is provided on the top surface 31 of the package substrate 30 in a shape of a frame. The first metal layer 51 has a rectangular frame shape corresponding to the rectangular package substrate 30 and is chamfered into a round form at the four corners. The first metal layer 51 is formed by, for example, metalizing a ceramic substrate. The first metal layer 51 is formed by plating a base member containing tungsten (W) or molybdenum (Mo) with nickel (Ni), gold (Au), etc. and has a stack structure of W/Ni/Au. The first metal layer 51 is bonded to the metal bonding part 53.

The second metal layer 52 is provided on an inner surface 44 of the window member 40 in a shape of a frame. The second metal layer 52 has a rectangular frame shape corresponding to the rectangular window member 40 and is chamfered into a round form at the four corners. The second metal layer 52 is formed by a method such as vacuum deposition and sputtering. The second metal layer 52 is a multilayer film in which titanium (Ti), platinum (Pt), and gold (Au) are built on the inner surface 44 of the window member 40 in the stated order. Chromium (Cr) may be used in place of titanium, and copper (Cu) and nickel (Ni) may be used in place of platinum (Pt). The second metal layer 52 is bonded to the metal bonding part 53.

The metal bonding part 53 is provided between the first metal layer 51 and the second metal layer 52 and bonds the package substrate 30 and the window member 40 to seal a space therebetween at the outer circumference of the package. The metal bonding part 53 is configured to fill a space between the first metal layer 51 and the second metal layer 52 and to be positioned on both sides (both inside and outside the package) that sandwich the second metal layer 52. The metal bonding part 53 is made of a metal material having a low melting point and contains, for example, a gold-tin (AuSn) or silver-tin (AgSn) alloy. The metal bonding part 53 spreads between the first metal layer 51 and the second metal layer 52 when melted to form eutectic bonding. It is preferred that the metal bonding part 53 is made of gold-tin containing tin (Sn) in an amount of 20 weight %~24 weight % to ensure high sealing reliability and a melting temperature of 300° C. or lower.

The sealing structure 50 is configured such that the entirety of the second metal layer 52 overlaps the first metal layer 51 from above, and the entirety of the second metal layer 52 is positioned in a region where the first metal layer 51 is provided. In other words, the sealing structure 50 is configured such that the second metal layer 52 is not positioned in a region where the first metal layer 51 is not provided, and the first metal layer 51 and the second metal layer 52 are not provided out of alignment. More specifically, the outer dimension and the inner dimension of the first metal layer 51 and the second metal layer 52 are adjusted to predetermined sizes described below in detail.

FIG. 2 schematically shows the dimensions of the first metal layer 51 and the second metal layer 52. As illustrated, the outer dimension $w_{11}$ of the first metal layer 51 is larger than the outer dimension $w_{21}$ of the second metal layer 52, and the inner dimension $w_{12}$ of the first metal layer 51 is smaller than the inner dimension $w_{22}$ of the second metal layer 52. Therefore, the width $w_{13}$ corresponding to the difference between the outer dimension $w_{11}$ and the inner dimension $w_{12}$ of the first metal layer 51 is larger than the width $w_{23}$ corresponding to the difference between the outer dimension $w_{21}$ and the inner dimension $w_{22}$ of the second metal layer 52. Further, the width $w_{13}$ of the first metal layer 51 is configured to be twice or more as large as the width $w_{23}$ of the second metal layer 52.

In one example, the outer dimension $w_{10}$ of the package substrate 30 is 3.5 mm, the outer dimension $w_{11}$ of the first metal layer 51 is 3.2 mm, the inner dimension $w_{12}$ of the first metal layer 51 is 2.3 mm, and the width $w_{13}$ of the first metal layer 51 is 0.45 mm. Further, the outer dimension $w_{20}$ of the window member 40 is 3.4 mm, the outer dimension $w_{21}$ of the second metal layer 52 is 3.0 mm, the inner dimension $w_{22}$ of the second metal layer 52 is 2.6 mm, and the width $w_{23}$ of the second metal layer 52 is 0.2 mm. In this example, the inner dimension difference (0.3 mm) between the first metal layer 51 and the second metal layer 52 is larger than the outer dimension difference (0.2 mm) between the first metal layer 51 and the second metal layer 52.

Figure 3:
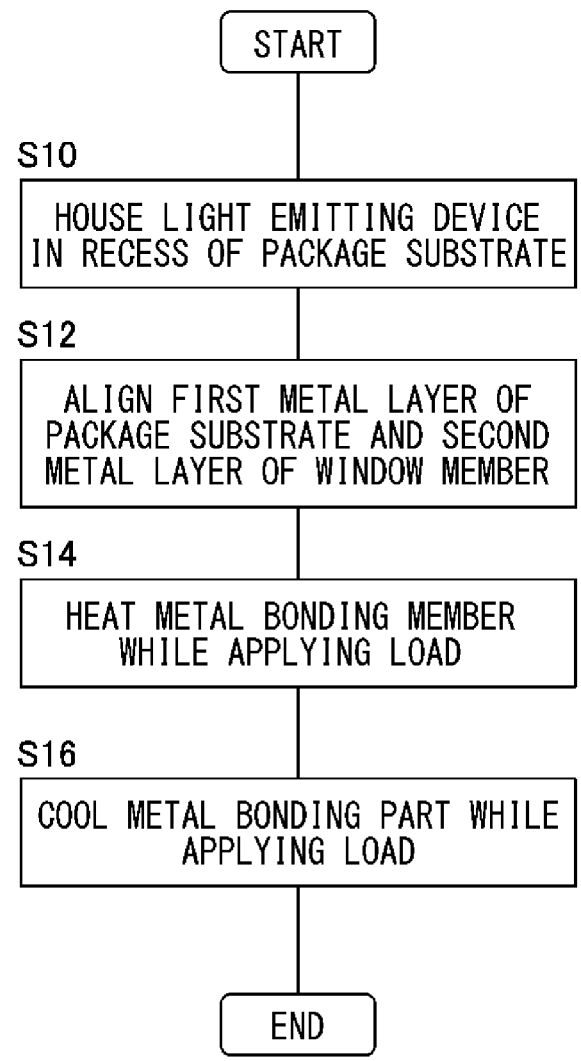
FIG. 3 is a flowchart showing a method of manufacturing the light emitting apparatus according to the embodiment.

A description will now be given of a method of manufacturing the light emitting apparatus 10. FIG. 3 is a flowchart showing a method of manufacturing the light emitting apparatus 10 according to the embodiment. The light emitting device 20 is housed in the recess 34 of the package substrate 30 (S10), the first metal layer 51 of the package substrate 30 and the second metal layer 52 of the window member 40 are aligned so that a metal bonding member 56 (see FIG. 4 mentioned later) is provided between the first metal layer 51 and the second metal layer 52 (S12). A load is then applied between the package substrate 30 and the window member 40 to heat the metal bonding member to place it in a melted state (S14). Subsequently, the metal bonding part 53 is cooled and solidified while a load is being applied between the package substrate 30 and the window member 40 (S16).

Figure 4:
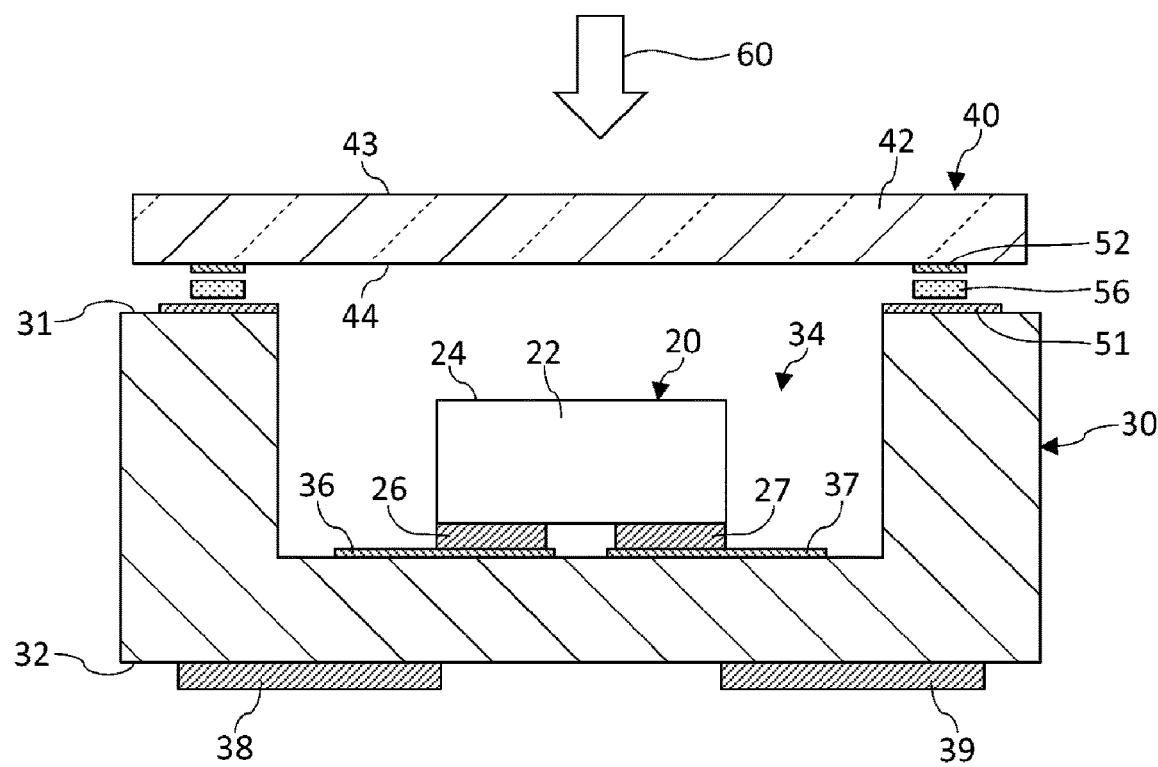
FIG. 4 is a cross-sectional view schematically showing a step of manufacturing the light emitting apparatus.

FIG. 4 is a cross-sectional view schematically showing a step of manufacturing the light emitting apparatus 10 and shows a step of providing the metal bonding member 56 and aligning the package substrate 30 and the window member 40. The package substrate 30 and the window member 40 are positioned so that the entirety of the second metal layer 52 is positioned in the region of the first metal layer 51. By aligning the central positions of the package substrate 30 and the window member 40, the entirety of the second metal layer 52 is provided on the first metal layer 51. Alternatively, the package substrate 30 and the window member 40 may be aligned such that one of the four corners of the package substrate 30 is aligned with one of the four corners of the window member 40. In this case, the central positions of the package substrate 30 and the window member 40 according to the above example will be misaligned within a range of ±50 μm. Regardless, the entirety of the second metal layer 52 is positioned on the first metal layer 51.

The metal bonding member 56 is provided between the first metal layer 51 and the second metal layer 52 thus aligned. The metal bonding member 56 is a gold-tin preform shaped in a rectangular frame corresponding to the second metal layer 52. The metal bonding member 56 has, for example, an outer dimension and an inner dimension identical to those of the second metal layer 52. The metal bonding member 56 may be temporarily secured to the first metal layer 51 or the second metal layer 52. The thickness of the metal bonding member 56 is about 10 μm~50 μm, and, preferably, about 15 μm~30 μm. By sealing the package by using a preform of such a shape and thickness while a load 60 is being applied, the metal bonding part 53 of a thickness of about 5 μm~20 μm is formed. The load 60 applied during sealing is 50 g or larger, and, preferably, 100 g or larger, and, more preferably, 200 g or larger.

It is preferred that the step of heating and melting the metal bonding member 56 be performed in an atmosphere of inert gas such as nitrogen ($N_2$). This prevents oxidation the gold-tin preform in a melted state and fills the interior of the package with the inert gas. However, the heating and melting step according to the embodiment may be performed in an atmosphere of dry air containing oxygen ($O_2$). By heating and melting the gold-tin preform while a load is being applied, it is possible to seal the package while also preventing oxidation of the metal bonding member 56 between the first metal layer 51 and the second metal layer 52.

Figure 5:
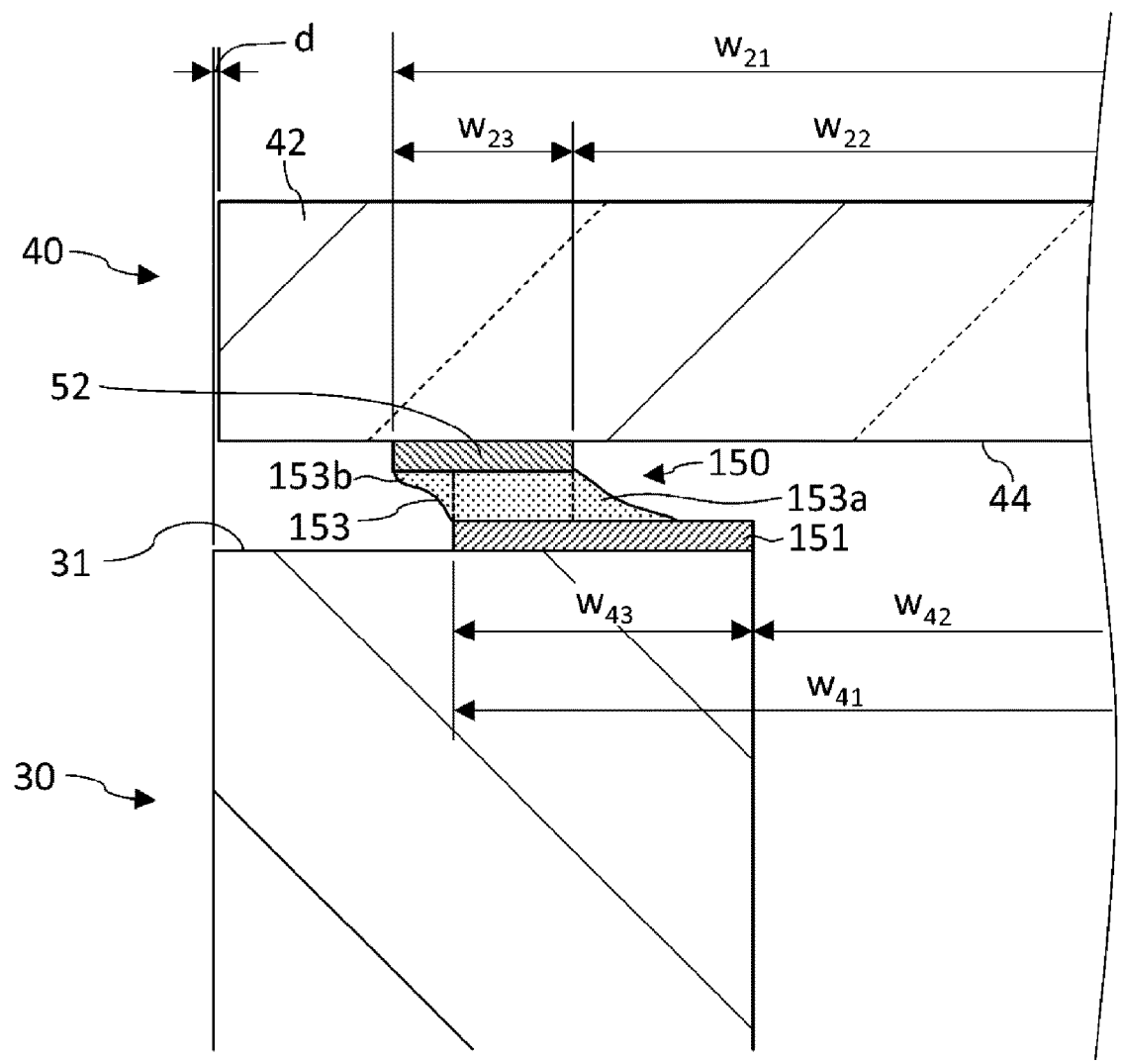
FIG. 5 is a cross-sectional view schematically showing a sealing structure of a light emitting apparatus according to a comparative example.

A description will be given of the advantage provided by the embodiment with reference to a comparative example. FIG. 5 is a cross-sectional view schematically showing a sealing structure 150 according to a comparative example. In the comparative example, the second metal layer 52 of the window member 40 is configured in a manner similar to that of the embodiment described above, but the outer dimension $w_{41}$ of a first metal layer 151 of the package substrate 30 is configured to be smaller than that of the embodiment described above. More specifically, the outer dimension $w_{41}$ of the first metal layer 151 is substantially identical to the outer dimension $w_{21}$ of the second metal layer 52. The inner dimension $w_{42}$ of the first metal layer 151 is similar to that the embodiment described above so that the width $w_{43}$ of the first metal layer 151 is smaller than that of the embodiment described above.

If a package substrate 130 and the window member 40 are aligned accurately according to the comparative example, the entirety of the second metal layer 52 may be positioned on the first metal layer 151. However, a slight misalignment may be produced due to a dimension error created during manufacturing or depending on the accuracy of alignment. As shown in FIG. 5, this could result in misalignment such that the first metal layer 151 and the second metal layer 52 overlap each other partially. For example, when the package substrate 130 and the window member 40 are provided such that the end faces thereof are aligned (the dimension d as illustrated is such that d=0), the second metal layer 52 protrudes outside the range of the first metal layer 151.

When the first metal layer 151 and the second metal layer 52 misaligned like this are bonded, a metal bonding part 153 that includes a first fillet 153a and a second fillet 153b is formed. The first fillet 153a is a fillet formed on the first metal layer 151 and is formed inside the range in which the first metal layer 151 and the second metal layer 52 overlap. The second fillet 153b is a fillet formed on the second metal layer 52 and is formed outside the range in which the first metal layer 151 and the second metal layer 52 overlap. The larger the misalignment between the first metal layer 151 and the second metal layer 52, the larger the width and smaller the thickness of the first fillet 153a and the second fillet 153b. If the package is sealed without applying a proper load between the package substrate 130 and the window member 40, the width of fillets may be increased because the fillet shape cannot be properly controlled.

Our knowledge shows that, if the metal bonding part is formed in a thin fillet shape, exfoliation starts at that portion with the result that the sealing performance is impaired. In particular, it is known that a large width of the second fillet 153b formed along the second metal layer 52 of the window member 40 makes it easy for a crack to be produced in the window member 40, starting at the portion where the second fillet 153b is formed. Therefore, if a misalignment is produced between the first metal layer 151 and the second metal layer 52 as in the case of the comparative example, the airtight sealing performance cannot be maintained and the reliability of the package is lowered.

Figure 6:
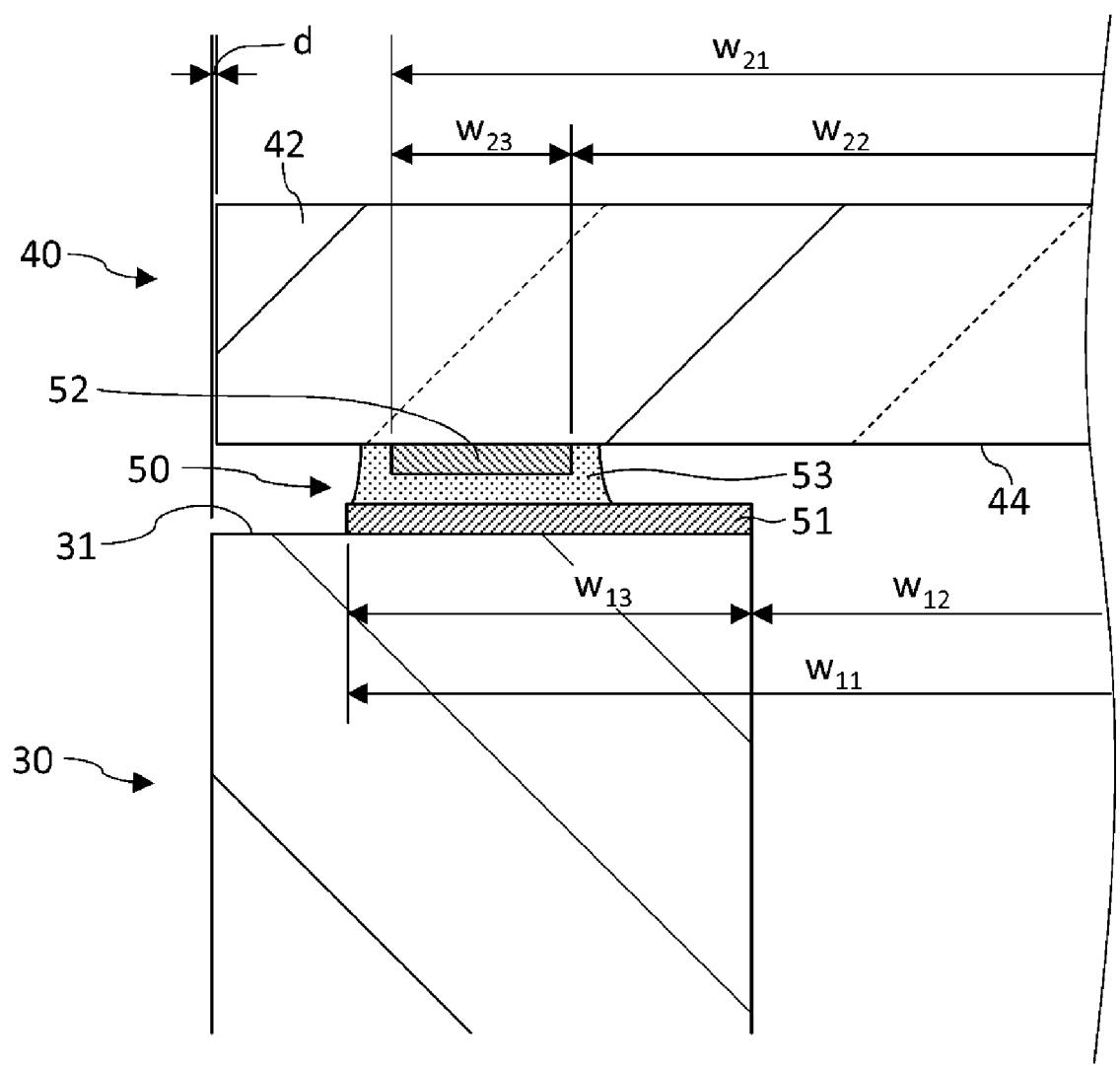
FIG. 6 is a cross-sectional view schematically showing the sealing structure of the light emitting apparatus according to the embodiment.

FIG. 6 is a cross-sectional view schematically showing the sealing structure 50 according to the embodiment. The figure shows a case where the package substrate 30 and the window member 40 are provided such that the end faces thereof are aligned (the dimension d as illustrated is such that d=0), and the central positions of the package substrate 30 and the window member 40 are misaligned. According to the embodiment, the outer dimension $w_{11}$ of the first metal layer 51 is larger than the outer dimension $w_{21}$ of the second metal layer 52 so that a misalignment produced due to a dimension error created during manufacturing or depending on the accuracy of alignment is canceled, and the entirety of the second metal layer 52 is positioned in the range in which the first metal layer 51 is provided. As a result, the range in which the metal layers overlap and are bonded is maximized. Further, application of a load during sealing allows the shape of the metal bonding part 53 formed between the first metal layer 51 and the second metal layer 52 to be properly controlled and inhibits the formation of thin fillets as shown in the comparative example. According to the embodiment, occurrence of cracks in the window member 40 due to a thin fillet is prevented. Since the metal layers are allowed to overlap and bonded solidly, airtight sealing is suitably maintained.

According to the embodiment, favorable airtightness is maintained even when the package substrate 30 and the window member 40 differ in the coefficient of thermal expansion. For example, no cracks or exfoliation of the window member 40 were observed when temperature cycle tests (−40° C./85° C.) were conducted 2000 times by using aluminum nitride (the thermal expansion coefficient: $4.6 \times 10^{-6}$/° C.) for the package substrate 30 and using quartz glass (the linear expansion coefficient: $0.6 \times 10^{-6}$/° C.) for the window member 40. Quartz glass has a thermal expansion coefficient smaller than that of ceramic materials such as AlN and $Al_2O_3$ and so undergoes a compression stress from the package substrate 30 in the process of cooling the metal bonding member after heating and melting the member. Generally, glass is highly resistant to compression stress. By using quartz glass, which has a small thermal expansion coefficient, a package structure in which cracks or exfoliation do not easily occur can be realized.

According to the embodiment, the fillet shape of the metal bonding part 53 on the inner side is formed with excellent reproducibility by configuring the inner dimension difference (e.g., 0.3 mm) between the first metal layer 51 and the second metal layer 52 to be larger than the outer dimension difference (e.g., 0.2 mm) between the first metal layer 51 and the second metal layer 52. The top surface 31 of the package substrate 30 and the first metal layer 51 may often have poor flatness for reasons related to manufacturing, etc., and micro-asperities may be produced depending on the location. This may result in locations wherein the metal bonding member 56 in a melted stated could easily flow into the package or locations where it could easily flow outside the package, depending on where the asperities are formed. This may result in the difficulty reproducibly form a proper fillet shape over the entirety of the top surface 31 of the package substrate 30. According to the embodiment, the metal bonding member in a melted stated is made to flow toward the inner side relatively more easily, by configuring the inner dimension difference between the first metal layer 51 and the second metal layer 52 to be large. This causes a proper fillet shape to be formed on the inner side of the package and realizes a package structure with high sealing performance.

Figure 7:
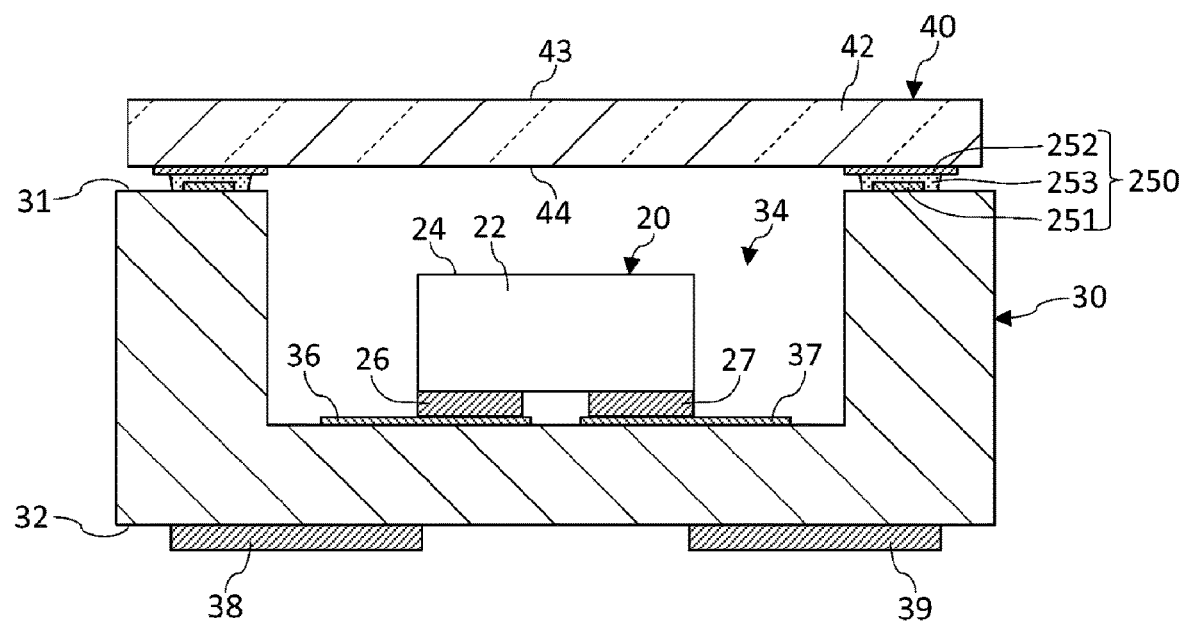
FIG. 7 is a cross-sectional view schematically showing a light emitting apparatus according to a variation.

FIG. 7 is a cross-sectional view schematically showing a configuration of a light emitting apparatus 210 according to a variation. The variation differs from the embodiment described above in that a second metal layer 252 provided in the window member 40 is formed to be larger than a first metal layer 251 provided in the package substrate 30. In other words, the variation is configured such that the entirety of the first metal layer 251 is configured to be positioned in a region where the second metal layer 252 is provided. A description will now be given of the light emitting apparatus 210, highlighting the difference from the embodiment described above.

The light emitting apparatus 210 includes the light emitting device 20, the package substrate 30, the window member 40, and a sealing structure 250. The sealing structure 250 includes a first metal layer 251, a second metal layer 252, and a metal bonding part 253.

The first metal layer 251 is formed, for example, to have a shape and dimension similar to those of the second metal layer 52 according to the embodiment described above, and the second metal layer 252 is formed, for example, to have a shape and dimension similar to those of the first metal layer 51 according to the embodiment described above. The outer dimension of the first metal layer 251 is smaller than the outer dimension of the second metal layer 252, and the inner dimension of the first metal layer 251 is larger than the inner dimension of the second metal layer 252. Also, the width of the second metal layer 252 is configured to be twice or more as large as the width of the first metal layer 251. The variation can achieve the same advantage as the embodiment described above and can maintain airtight sealing in the package suitably.

Described above is an explanation based on an exemplary embodiment. The embodiment is intended to be illustrative only and it will be understood by those skilled in the art that various design changes are possible and various modifications are possible and that such modifications are also within the scope of the present invention.

In the embodiment and the variation described above, the case of including only a light emitting device in the package of a light emitting apparatus is shown. In a further variation, electronic components other than a light emitting device may be built in the package to provide additional functions. For example, a Zener diode for protecting the light emitting device from an electric surge may be built in the housing. A fluorescent body for converting the wavelength of the light output by the light emitting device may be built in. Still alternatively, an optical device for controlling the orientation of the light emitted by the light emitting device may be built in.

In the embodiment and the variation described above, a light emitting apparatus in which a semiconductor light emitting device is sealed in the package is shown. In a further variation, the sealing structure described above may be used to seal a light receiving device. For example, the package structure described above may be used to seal a light receiving device for receiving deep ultraviolet light. In essence, the package described above may be used to seal an optical semiconductor device.

It should be understood that the invention is not limited to the above-described embodiment but may be modified into various forms on the basis of the spirit of the invention. Additionally, the modifications are included in the scope of the invention.

What is claimed is:

1. An optical semiconductor apparatus comprising:
    a package substrate that includes a recess that opens on a top surface of the package substrate;
    an optical semiconductor device housed in the recess;
    a window member provided to cover an opening of the recess; and
    a sealing structure that seals a space between the package substrate and the window member, wherein
    the sealing structure includes a first metal layer provided in a shape of a frame on the top surface of the package substrate, a second metal layer provided in a shape of a frame on an inner surface of the window member, and a metal bonding part provided between the first metal layer and the second metal layer,
    in a plan view in a direction in which the package substrate and the window member overlap, an outer dimension of the window member is smaller than an outer dimension of the package substrate, an outer dimension difference between the first metal layer and the second metal layer is larger than an outer dimension difference between the window member and the package substrate, and the window member is provided inside the outer circumference of the package substrate, and
    the sealing structure is configured such that an entirety of one of the first metal layer and the second metal layer is positioned in a region where the other of the first metal layer and the second metal layer is provided.

2. The optical semiconductor apparatus according to claim 1, wherein
    an outer dimension of the first metal layer is smaller than an outer dimension of the window member, and an outer dimension difference between the window member and the first metal layer is larger than an outer dimension difference between the window member and the package substrate.

3. The optical semiconductor apparatus according to claim 1, wherein
    the sealing structure is configured such that an entirety of the second metal layer is positioned in a region where the first metal layer is provided, and the metal bonding part is positioned on both sides sandwiching the second metal layer.

4. The optical semiconductor apparatus according to claim 3, wherein
    an outer dimension of the first metal layer is larger than an outer dimension of the second metal layer, and an inner dimension of the first metal layer is smaller than an inner dimension of the second metal layer, and
    an inner dimension difference between the first metal layer and the second metal layer is larger than an outer dimension difference between the first metal layer and the second metal layer.

5. The optical semiconductor apparatus according to claim 3, wherein
    a difference between an outer dimension and an inner dimension of the first metal layer is twice or more as large as a difference between an outer dimension and an inner dimension of the second metal layer.

6. The optical semiconductor apparatus according to claim 1, wherein
    the window member is made of a material having a smaller coefficient of thermal expansion than the package substrate.

7. The optical semiconductor apparatus according to claim 1, wherein
    the optical semiconductor device is a light emitting device for emitting deep ultraviolet light, the window member is made of quartz glass, and the metal bonding part contains gold-tin (AuSn).

8. A method of manufacturing the optical semiconductor apparatus according to claim 1 comprising:
    housing the optical semiconductor device in the recess of the package substrate;
    providing the window member to cover the opening of the recess; and sealing a space between the package substrate and the window member by heating the metal bonding part provided between the first metal layer and the second metal layer, wherein in the plan view in the direction in which the package substrate and the window member overlap, the outer dimension of the window member is smaller than the outer dimension of the package substrate, and the outer dimension difference between the first metal layer and the second metal layer is larger than the outer dimension difference between the window member and the package substrate, the providing provides, in the plan view in the direction in which the package substrate and the window member overlap, the window member inside the outer circumference of the package substrate to align the first metal layer and the second metal layer such that the entirety of one of the first metal layer and the second metal layer is positioned in the region where the other of the first metal layer and the second metal layer is provided.

9. The method of manufacturing an optical semiconductor apparatus according to claim 8, wherein the sealing includes heating the metal bonding part while a load is being applied between the package substrate and the window member.

10. The method of manufacturing an optical semiconductor apparatus according to claim 8, wherein the sealing includes cooling the metal bonding part while a load is being applied between the package substrate and the window member, after heating the metal bonding member.

11. The method of manufacturing an optical semiconductor apparatus according to claim 8, wherein the metal bonding part is an gold-tin (AuSn) metal plate having a shape of a frame corresponding to the first metal layer or the second metal layer.

12. The method of manufacturing an optical semiconductor apparatus according to claim 11, wherein the metal bonding part has a thickness of not less than 10 µm and not more than 50 µm.

* * * * *